United States Patent [19]

Cantiant et al.

[11] Patent Number: 5,386,392
[45] Date of Patent: Jan. 31, 1995

[54] PROGRAMMABLE HIGH SPEED ARRAY CLOCK GENERATOR CIRCUIT FOR ARRAY BUILT-IN SELF TEST MEMORY CHIPS

[75] Inventors: Thierry Cantiant, Dannaire-Les-Lys; Bertrand Gabillard, Paris; Jean-Paul Mifsud, Lieusaint, all of; Stuart Rapoport, Washington, D.C.

[73] Assignee: International Business Machines Corporation, Armonk, N.Y.

[21] Appl. No.: 255,697

[22] Filed: Jun. 8, 1994

[30] Foreign Application Priority Data

Jun. 30, 1993 [EP] European Pat. Off. ............ 93480085

[51] Int. Cl.⁶ .............................................. G11C 11/30
[52] U.S. Cl. .............................. 365/233; 365/189.01; 327/292; 327/295
[58] Field of Search ............ 307/269; 365/233, 189.01, 365/189.05, 230.01

[56] References Cited

U.S. PATENT DOCUMENTS

| | | | |
|---|---|---|---|
| 4,692,633 | 9/1987 | Ngai et al. | 307/269 |
| 5,172,010 | 12/1992 | Montegari | 307/265 |
| 5,327,394 | 7/1994 | Green et al. | 365/233 |

Primary Examiner—Terrell W. Fears
Attorney, Agent, or Firm—H. Daniel Schnurmann

[57] ABSTRACT

An integrated circuit incorporating at least a SRAM that includes memory, a data-out shift register, an ABIST data compression circuit, a fail address register and an array clock generator (ACG), the ACG comprising a clock chopper that comprises a first AND gate having an inherent delay DEL1, a first input for receiving a D clock signal, a second input for receiving the D signal inverted by an invertor having an inherent delay DEL2, and an output that generates an ungated LSSSD C clock signal; and a second AND gate having an inherent delay DEL4, a first input connected to the output of an inverter having an inherent delay DEL3, the inverter is coupled to the invertor having the delay DEL2, a second input is controlled by the D clock signal and an output for generating LSSD clock signals B and S.

9 Claims, 4 Drawing Sheets

PROGRAMMABLE HIGH SPEED ARRAY CLOCK GENERATOR CIRCUIT FOR ARRAY BUILT-IN SELF TEST MEMORY CHIPS

FIELD OF THE INVENTION

The present invention relates to integrated circuits of the memory type having built-in self-test capabilities for logic and memory fault detection. It more particularly relates to a fast high density data compression circuit used therein.

BACKGROUND OF THE INVENTION

As memories grow faster, denser and more complex, there is an increased demand for ABIST (Array Built-In Self-Test) structures offering high speed and high test coverage, while at the same time consuming minimal area of a semiconductor chip. By way of example, FIG. 1 shows the block diagram architecture of a state of the art SRAM macro 10 provided with an ABIST unit 11. A similar architecture is described in U.S. Pat. No. 5,173,906 of common assignee. The functional units shown in FIG. 1, either form part of a stand-alone SRAM or the SRAM macro of a logic array of an integrated circuit chip. In the latter case, the chip may include a plurality of such macros, each provided with its own dedicated ABIST unit. The integrated circuit chip described is part of a wafer fabricated in a very large scale integration (VLSI) semiconductor technology and is presumed to be designed according to level-sensitive scan design (LSSD) rules.

As known to those skilled in the art, the SRAM macro 10 shown in FIG. 1 has three basic modes of operation: a SYSTEM mode, in which the SRAM macro 10 operates normally, i.e., where the memory unit 12 is either read or written, using the data-in signals DATAIN1 to DATAINM, the SRAM address signals ADDIN1 to ADDINP, and the read/write control signal R/WIN (where in M and P are, respectively, the bit widths of the data-in bus DATAIN and the SRAM address bus ADDIN). A second mode is required to satisfy LSSD requirements: the SCAN mode which is used for initializing/analyzing (SCAN-IN/SCAN-OUT) all the data of the latch pairs that form an LSSD chain. Finally, a third mode: the ABIST mode, in which the functionality of memory unit 12 is tested. It is a self-test which is first performed in a manufacturing environment before the chip is commercially released. A slightly different, more relaxed self-test is performed while the chip is incorporated in a system, for example, at the customer location, and thus in a system environment. As a result, the ABIST mode is used in different environments referred to hereinafter as the ABIST manufacturing sub-mode and the ABIST system sub-mode.

In the ABIST mode, according to the fundamentals of the self-test technique, the ABIST unit 11 generates a plurality of test vectors. Each test pattern consists of a set of deterministic 0's and 1's that are first written into memory unit 12, then read and compared with an expected pattern. The test pattern sequences play a key role in exercising the memory unit 12 to verify whether the memory unit 12 under test is functioning properly, i.e., to determine whether the READ and WRITE operations were successful. To that end, the ABIST unit 11 generates self-test data signals STDATA, self-test address signals STADD, and the self-test read/write control signal STRW.

Three groups of multiplexers select the signals to be fed to the memory unit 12. These include either the external signals mentioned above which are generated from outside the SRAM macro 10, namely, DATAIN1 ... DATAINM, ADDIN1 ... ADDINP, and R/WIN signals, or the internal self-test signals generated by the ABIST unit 11 mentioned above, namely, the STDATA, STADD, and STRW signals. The multiplexers forming these three groups are respectively referenced as 13-1 to 13-M, 13'-1 to 13'-P, and 13". The selection is made by the ABIST signal. Normally, external signals are selected when the ABIST signal is held at a logic "0", whereas signals that are internally generated by the ABIST unit 11 are selected when it is held at a logic "1". The ABIST signal thus allows the SRAM macro 10 to operate either in the SYSTEM mode or in the ABIST mode. The three groups of multiplexers 13-1 to 13-M, 13'-1 to 13'-P, and 13" form multiplexer block 13. The outputs of the first and second groups are labelled DATA bus and ADD bus, with M and P respective bit widths. The output of multiplexer 13" is a single line that carries the R/W control signal that determines the READ/WRITE operating mode of memory 12.

The data-out signals that are outputted by memory 12 are stored in a plurality of data-out L1/L2 pairs of latches (14-1 to 14-M) forming the data-out shift register 14. Generally, these data-out latch pairs are incorporated into memory 12. The data-out signals that are outputted by the L1 and L2 latches are labelled DATAOUT1 to DATAOUTM (DATAOUT bus) and DOUT1 to DOUTM (DOUT bus), respectively.

In the ABIST mode, after performing a READ operation, expected data signals labelled EXDATA are generated by the ABIST unit 11 on the EXDATA bus and are compared in the data compression unit 15 via data-out signals DOUT1 to DOUTM. Typically, only four test patterns are used on each word of the memory unit 12: alternate 0's and 1's, i.e., 0101 ... 01 and 1010 ... 10, all 0's and all 1's. Alternatively, there are only four self-test data signals, labelled STDATA0, STDATA1 and their respective complements. Because of the particular structure of these four test patterns, the data-out signals DOUT1 to DOUTM are divided into even and odd data-out signals. The even data-out signals that are outputted from the data-out shift register unit 14 are labelled DOUT2, DOUT4, ..., DOUT2j, and likewise, the odd data-out signals are labelled DOUT1, DOUT3, ..., DOUT(2j-1), where J is an integer equal to M/2, assuming that M is an even number. Since all the even and odd numbered bits of the data-out signals have simultaneously the same '0' or '1' value, only two expected data signals are required, each one consisting of a single bit, EXDATA0 and EXDATA1. For instance, assuming the data-out signals to be read on the DOUT bus are: 010101 ... 01, the expected data signal EXDATA0 (for the even numbered bits) will be "1" and the expected data signal EXDATA1 (for the odd numbered bits) "0". EXDATA0 and EXDATA1 signals are thus the expected results for the even and odd data-out signals, respectively. Finally, data compression unit 15 generates a signal labelled RESULT which is held at a high logic level, namely, at "1", if a mismatch occurs during the comparison. By mismatch, it is to be understood that at least one data-out signal does not have the same logic value as its corresponding even or odd expected data generated by the ABIST structure 11. This mismatch is often caused by a defective word line in the memory unit 12 at a predetermined address. This mismatch is usually referred to as a "fail". Alternatively, if all data-out signals match the corresponding even or odd expected data signals (which means no fail is detected), the RESULT signal is held at the low logic level, i.e. at "0". The RESULT signal, which is often referred to as the FAIL FOUND LAST CYCLE signal, indicates after completing a READ operation, whether the memory unit 12 at the current address is defective. The RESULT signal is thus indicative of the fail/no fail status of memory unit 12 on a cycle by cycle basis. Another key component of the state of the art SRAM macro 10 is the fail register unit 16. It is required because, in the ABIST manufacturing sub-mode, the addresses of the defective word lines have to be identified, then memorized for subsequent use in the SYSTEM mode. When the RESULT signal is raised to a logic "1", indicating the presence of a failure, the word portion of the current address generated by the ABIST unit 11 on the STADD bus, labelled STADD*, is stored in a bank of pairs or latches of the fail address register 16. This stored word address thus corresponds to the address of a defective word line.

The ABIST unit 11 also generates a CNOOP (NOOP stands for NO OPERATION) signal to inhibit the ABIST self-test mode when the totality of the test pattern sequences has been fully exercised on memory 12. This signal is required when there is a plurality of SRAM macros embedded in a single semiconductor chip. These macros may have different sizes requiring different durations for their respective test. The CNOOP signal generated by the ABIST unit of each SRAM macro allows the memory units of all macros to be simultaneously tested.

Clocking the SRAM macro 10 is achieved using the standard procedures in accordance with LSSD rules. In state of the art architecture, a SRAM as illustrated in FIG. 1, clocking would normally be implemented by standard external LSSD clock signals labelled A, B, C, S, and CS (CHIP SELECT for a stand-alone SRAM chip or ARRAY SELECT for a SRAM macro). Note that the clock signal S, which is substantially the same as the clock signal B, is applied to the L2 latches of the latch pairs 14-1 to 14-M of the data-out shift register 14. In the ABIST manufacturing sub-mode, the clock and CS signals are derived from the tester. In the ABIST system sub-mode, these signals are derived from the system clock. The SCAN-IN (SI) signal is applied to the ABIST unit 11 according to standard LSSD rules as illustrated in FIG. 1. However, for sake of simplicity, the SCAN-OUT signal generated by ABIST 11 in response to the SCAN-IN signal to be applied to the next latch pair, etc., along the whole LSSD chain, is not shown. In the following description, only latches will be referred to while it is clear, that according to LSSD rules, they are in reality latch pairs. All these signals are directly applied to ABIST 11 and/or to the memory 12, except for the clock C and CS signals. The clock signal C is applied to one input of a 2-way AND gate 17A. The CS signal is applied to one input of the 2-way AND gate 17B. The CNOOP signal is applied to the second input of AND gates 17A and 17B as a gating signal in order to block, when needed, the transmission of the respective clock C and CS signals. This occurs when the self-test has been completed in the ABIST mode and permanently in the SYSTEM mode. The A, B, and S clock signals are used during the SCAN mode, whereas the B, C, S and CS signals are used during the ABIST mode. The CS signal is used alone in the SYSTEM mode while the LSSD clock signals are held in a nonactive state. Numeral 18 schematically illustrates the clock distribution scheme in the SRAM macro 10 and also includes the internal chip clock distribution network servicing it. This terminates the description of a state of the art SRAM macro provided with an ABIST structure.

In the ABIST mode, it is essential to verify that the memory 12 functions correctly in a system having a very short cycle time (tc). More particularly, in the ABIST manufacturing sub-mode, it is an absolutely requirement that an accurate measurement of the memory access time (ta) be obtained, particularly, in view of the continuous trend towards decreasing the system cycle time coupled to the design of high speed SRAM macros havinh themselves a reduced memory access time. In this regard, it is difficult if not impossible to test the memory 12 of the SRAM macro 10 of FIG. 1 having such short system cycle time and make accurate memory access time measurements with a clock distribution scheme, such as 18, because of the unacceptable imprecision caused by uncontrollable clock signal skews. This is particularly true in the ABIST manufacturing sub-mode where the imprecision inherent to the clock distribution scheme 18 originates from a variety of factors such as: tester limitations, width variations of the clock signals generated by the tester, off-chip line delays caused by the lines between the tester and the chip, chip internal clock distribution networks, etc. In addition, calibration of the clock signals generated by the tester is required for a state of the art SRAM macro 11. This calibration is process dependent and thus must be done for each chip lot. The calibration is achieved by estimating the internal delays after accurate kerf measurements. As a result, it is expensive and time consuming to perform an accurate memory access time measurement in an ABIST manufacturing sub-mode because it requires high performance and expensive testers. However, this skew also exists in the ABIST system sub-mode. It is caused by the chip internal clock distribution network and by mismatches in the internal chip path delay thereof. For each clock signal, the mismatch results from physical wiring layout imbalances and device differences between the driver circuits that buffer the clock signals, which in turn results in layout and process dependency.

In contrast with the approach illustrated in conjunction with FIG. 1, the present invention aims to overcome all the drawbacks based on the fact that the development of high speed SRAM macros would advantageously necessitate the inclusion of a dedicated array clock generator (ACG) circuit within each macro in place of the clock distribution scheme 18. This ACG circuit is driven by a single input D clock signal and generates all the clock signals that are required for a proper operation of the ABIST mode. The input D clock signal is supplied externally to the SRAM macro either from the tester in the ABIST manufacturing sub-mode or from a signal directly derived from the system clock in the ABIST system sub-mode. In summary, the ACG circuit generates the LSSD B, C and S clock signals required by the ABIST structure and the CS signal required by the memory unit from a single input D clock signal.

OBJECTS OF THE INVENTION

Accordingly, it is a primary object of the present invention to provide a dedicated array clock generator circuit capable of servicing a high speed SRAM macro including an ABIST unit in systems having short cycle times.

It is another object to provide an array clock generator circuit for high speed SRAM macros that include an ABIST unit, to generate the required clock signals during the ABIST mode with minimal clock signal skews.

It is another object to provide an array clock generator circuit for high speed SRAM macros including an ABIST, which does not require high performance and expensive testers for an accurate measurement of the memory access time during the ABIST manufacturing sub-mode.

It is still another object of the present invention to provide an array clock generator circuit for high speed SRAM macros including an ABIST unit in two distinct embodiments that can be selected and adapted to perform optimally in an ABIST sub-mode.

SUMMARY OF THE INVENTION

These objects will be accomplished in particular by an integrated circuit, incorporating at least one SRAM macro including a memory unit and an ABIST unit, and which further includes a dedicated array clock generator circuit in which a chopper circuit generates an ungated clock signal (CACG*) at its output in response to a single input D clock signal. This ungated signal in conjunction with a gating signal (CNOOP) supplied by the ABIST are applied to a 2-way AND to generate the LSSD C clock signal (CACG), that is inhibited when the SRAM is not in the ABIST mode. The ARRAY SELECT (CSACG) signal is derived therefrom via a second inverter. This chopper circuit includes a first 2-way AND gate (inherent delay DEL1), whose first input is driven by the D clock signal. Its second input is likewise driven by the D clock signal, via a first inverter and a first delay line (delay DEL2) serially connected. The output of the first delay line is also connected to the first input of a second 2-way AND gate (inherent delay DEL4) via a third inverter and a second delay line (delay DEL3). A 2-way multiplexer (inherent delay DEL5), controlled by a control signal STDS0, applies either directly the clock signal D or the output signal of the second delay line to the second input of the second 2-way AND gate via a fourth inverter. LSSD clock signals B (BACG) and S (SACG) are available at the output of the second 2-way AND gate. Control signal STDS0 selects the appropriate configuration for an optimized operation of the ACG circuit in either of the two ABIST sub-modes.

From this construction, better synchronization results between the clock signals (e.g. BACG, CACG, ...), the signals generated by the ABIST in the ABIST mode (e.g., STDATA, EXDATA, ...), and the memory data-out signals (DOUT1, ..., DOUTM), because more precise clocking and minimal clock skew are obtained. The ACG circuit is described in two embodiments, each optimized for its respective ABIST sub-mode. As a result, the correct functioning of the memory unit can be performed in either one of the two ABIST sub-modes, for memory units having a short cycle time. Finally, the ACG circuit is fully compatible with the new low cost test strategy (thus dispensing of expensive testers) and results in significantly more accurate memory access time measurements.

BRIEF DESCRIPTION OF THE DRAWINGS

The features believed to be characteristic of this invention are set forth in the claims. The invention itself, however, as well as other objects and advantages thereof, may be best understood by reference to the following detailed description of an illustrated preferred embodiment to be read in conjunction with the accompanying drawings.

DETAILED DESCRIPTION OF THE INVENTION

Figure 1:
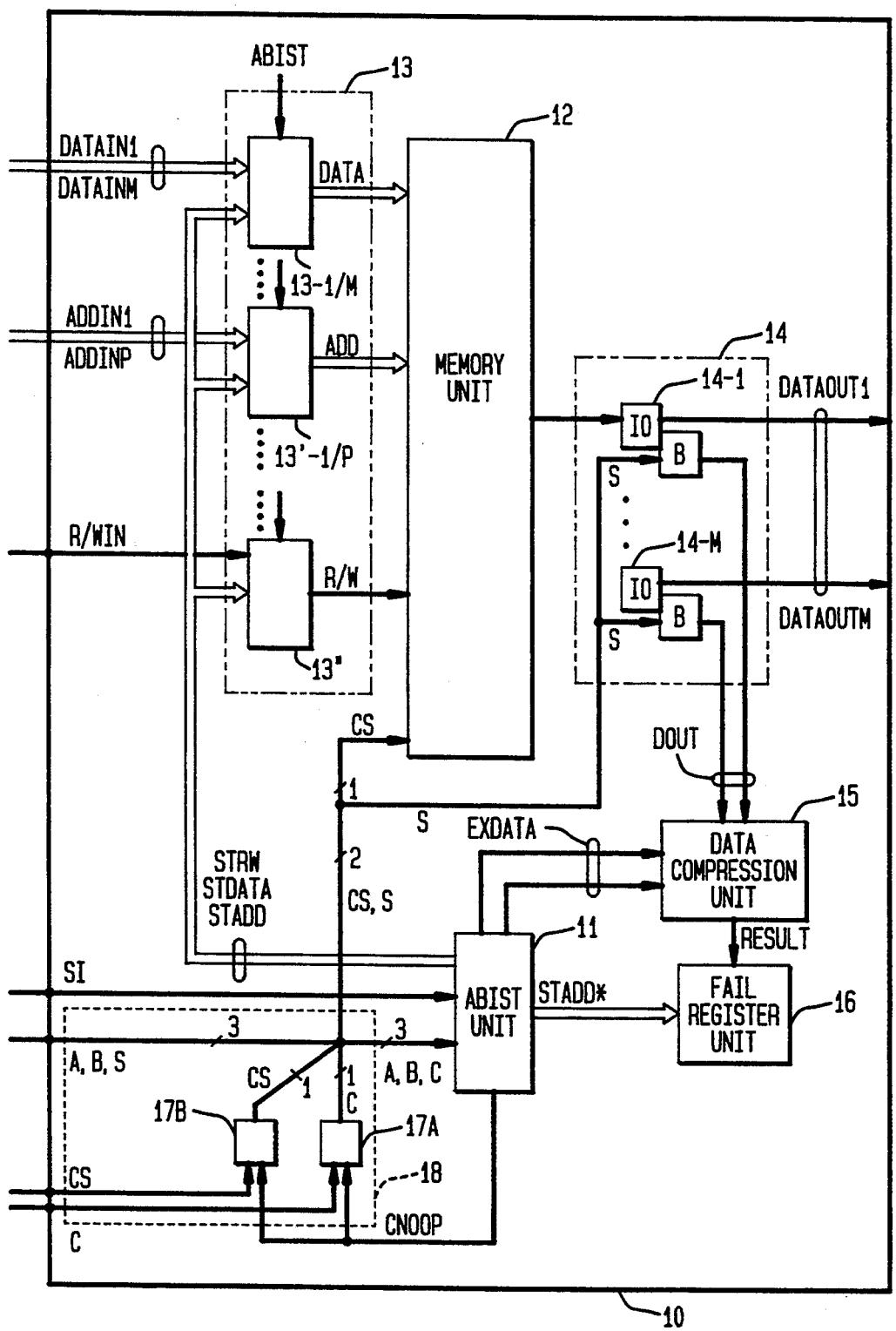
FIG. 1 shows a partial schematic view of the block diagram architecture of a state of the art SRAM macro including an ABIST unit.
Figure 2A:
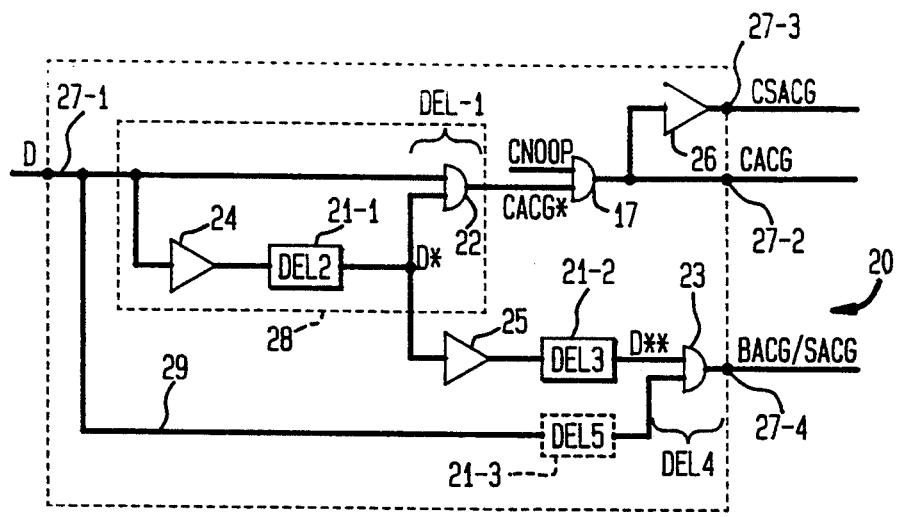
FIG. 2A shows a schematic block diagram of a first preferred embodiment of the array clock generator circuit of the present invention in the ABIST manufacturing sub-mode.

FIG. 2A shows the detailed circuit construction of a first preferred embodiment of the ACG circuit optimized for the ABIST manufacturing sub-mode according to the present invention. In this configuration, the circuit referenced 20 in FIG. 2A uses both edges of an input clock signal labelled D which is generated by the tester in this sub-mode. Circuit 20 includes two delay lines 21-1 and 21-2 having, respectively, delays labelled DEL2 and DEL3, two 2-way AND gates 22 and 23, and three inverters 24 to 26. It further includes a 2-way AND gate 16 whose role will be explained hereinafter. Both input and output terminals are generically referenced 27. The D clock signal is applied to the input terminal 27-1 which is connected to one input of AND gate 22 and inverter 24. The output of inverter 24 is connected to the input of delay line 21-1, whose output is connected to the second input of AND gate 22 and to the first input of AND gate 23 via inverter 25 and delay line 21-2. The signals at the output of delay lines 21-1 and 21-2 are respectively labelled D* and D**. The combination of AND gate 22, inverter 24 and delay line 21-1 result in a conventional signal chopper circuit referenced 28 in FIG. 2A. The delays inherent to AND gates 22 and 23 are respectively referred to as DEL1 and DEL4. The D clock signal is applied to the second input of AND gate 23 by connection 29 or optionally via a delay line 21-3 that introduces a delay DEL5. To facilitate the memory access time measurement, it is recommended that DEL1=DEL4 (or DEL1=DEL4+DEL5, if the option mentioned above is implemented). The ungated clock signal CACG* available at the output of AND block 22 is gated at AND gate 16 by gating signal CNOOP generated by the ABIST unit 11 when the clock signal CACG at output terminal 27-2 is inhibited. 2-way AND gate 17 thus plays the role of AND gates 17-A and 17-B of FIG. 1. The CSACG signal is available through inverter 26 at terminal 27-3. The BACG and the SACG signals are generated by AND gate 23 and are available at the same common output terminal 27-4.

Figure 2B:
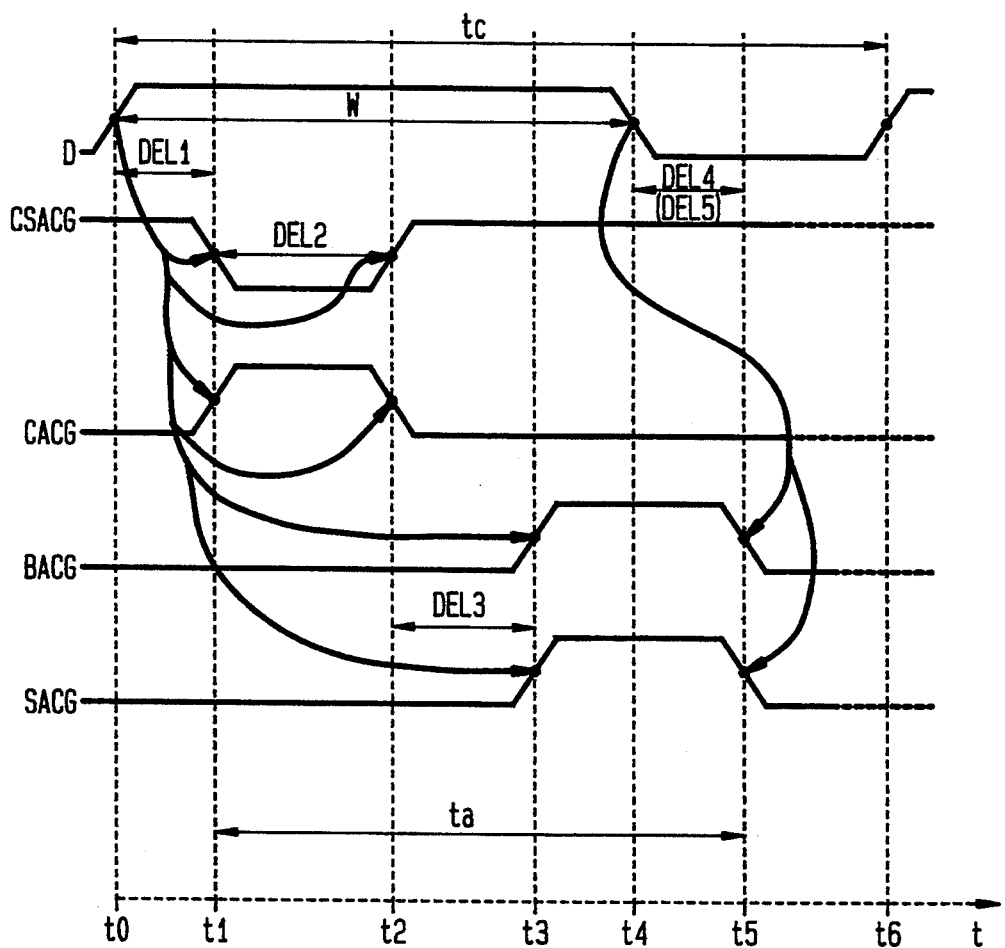
FIG. 2B shows waveforms of the clocking signals generated by the array clock generator circuit of FIG. 2A.

Operation of circuit 20 will be best understood by reference to FIG. 2B. As apparent from FIG. 2B, which illustrates the timing diagrams of the signals generated by the ACG circuit 20 of FIG. 2A in the ABIST manufacturing sub-mode. The rising edge of the D Clock signal pulse initiates generation of the positive CACG clock signal, the negative CSACG signal, and the rising edges of both the BACG and SACG clock signals. The falling edge of the D clock signal initiates generation of the falling edges of the BACG and SACG (BACG-/SACG) clock signals after a delay equal to DEL4 (or DEL4+DEL5). The width or duration W of the D clock signal determines when the SACG clock signal falls, which in turn causes the data-out signals generated by memory 12 to be captured by the data-out shift register 14 (FIG. 1). The BACG and SACG clock signals are thus primarily controlled by varying the pulse width W of the incoming D clock signal, so that the memory access time measurement, illustrated by delay ta in FIG. 2B, is performed by ABIST 11. Note that if delay DEL1 of AND gate 22 is preferably equal to delay DEL4 (or DEL4+DEL5) then ta=W, as apparent from FIG. 2B. Moreover, these delays are preferably designed to track each other in terms of process variations. Thus, any process variations in ACG circuit 20 will be subtracted from the memory access time measurements. The tracking of the delays DEL1 and DEL4 (and possibly DEL5) ensures a more accurate access time measurement, because ACG circuit 20 is more process and layout independent. This first configuration is optimized for the ABIST manufacturing sub-mode when the macros are individually tested on a serial basis by the external tester which can precisely control the width W of the D clock signal, and which is the same for all the macros within the chip. Circuit 20 thus allows an accurate memory access time measurement simply by varying the D clock signal pulse width when the chip is tested during the ABIST manufacturing sub-mode, and it is thus easy to determine its operating limits. However, whereas a precise control of the pulse width is relatively simple in a manufacturing environment thanks to the tester, it becomes quite difficult in the system environment. A memory access time measurement is not performed in the ABIST system sub-mode, as will now be explained.

Figure 3A:
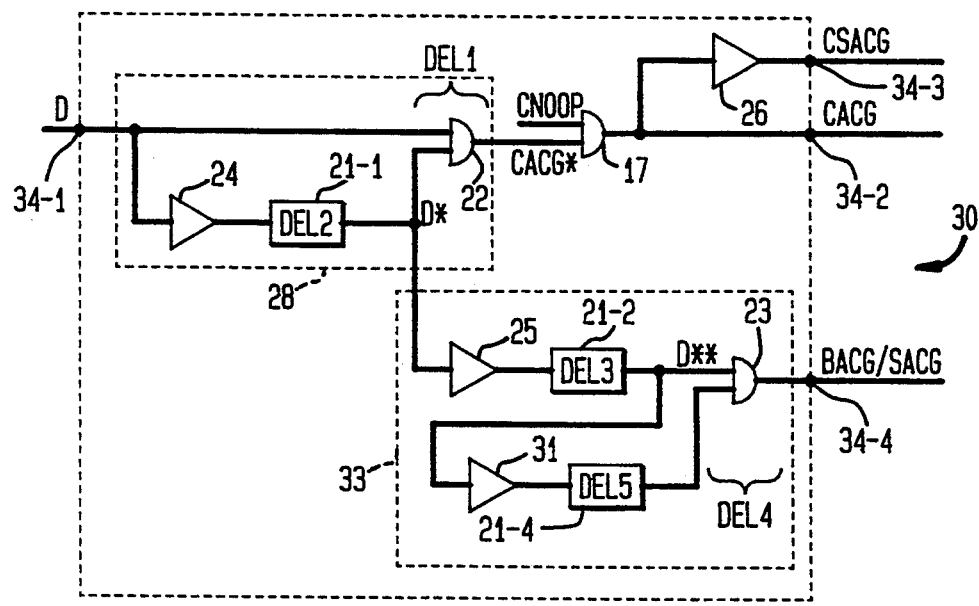
FIG. 3A shows a schematic block diagram of a second preferred embodiment of the array clock generator circuit of the present invention in the ABIST system sub-mode.

The preferred embodiment of the ACG circuit of the present invention for the ABIST system sub-mode is shown in FIG. 3A, where it bears numeral 30. According to this second configuration, circuit 30 only uses the rising edge of the D clock signal as will be explained later. FIG. 3A circuit has much commonality with the circuitry shown in FIG. 2A as apparent from the drawings (where the common part has been emphasized by thick lines), according to a significant feature of the present invention. The identical hardware comprises the two delay lines 21-1 and 21-2, whose delays are still referenced DEL2 and DEL3, the two 2-way AND gates 22 and 23, and the three inverters 24 to 26 that are interconnected in a similar manner. Likewise, it still comprises AND gate 17 to gate the CACG* clock signal with the CNOOP signal. However, now the output of delay line 21-2 is not only connected to the first input of AND gate 23 but also to the second input of the AND gate 23 via inverter 31 and delay line 21-4 (delay DEL5). AND gate 23, inverters 25 and 31, delay lines 21-2 and 21-4 form block 33. Input and output terminals are generically referenced 34. The D clock signal is applied to input terminal 34-1, and the clock signals CACG, CSACG, BACG/SACG generated by ACG circuit 30, are respectively available at output terminals 34-2 to 34-4.

Figure 3B:
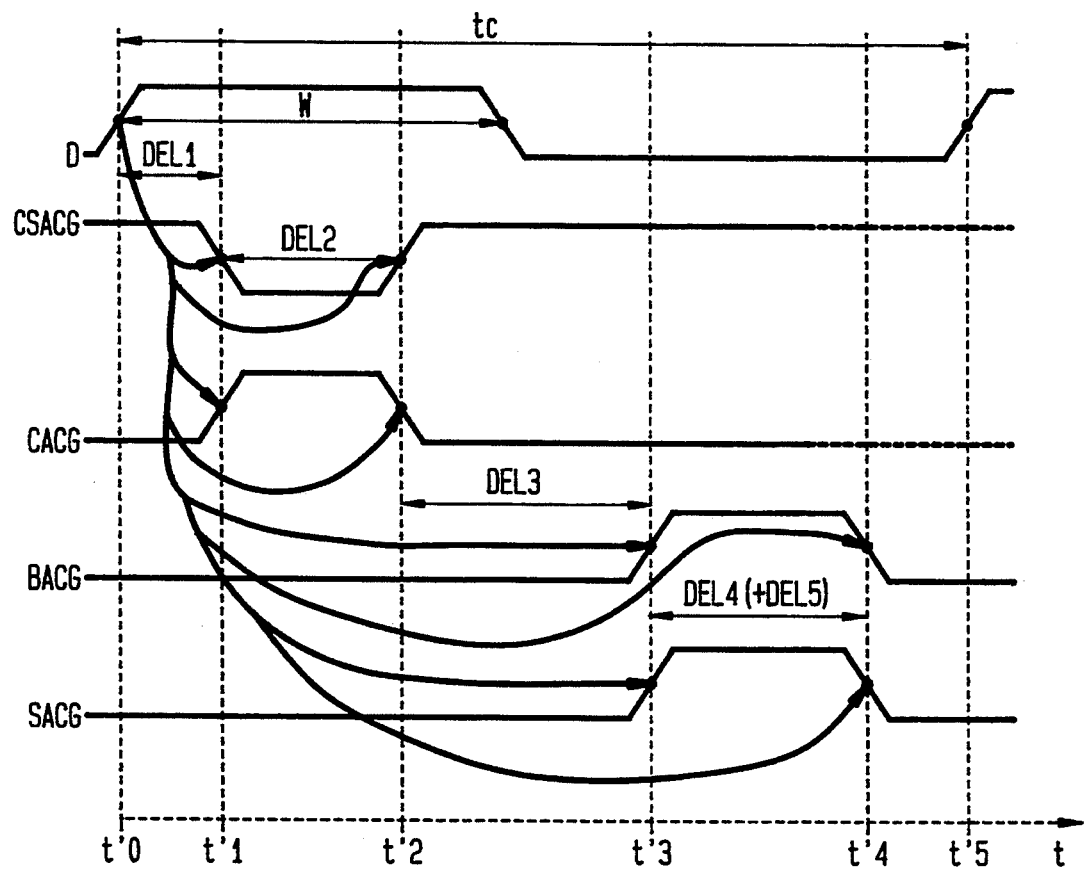
FIG. 3B shows waveforms of the clocking signals generated, by the array clock generator unit of FIG. 3A.

Operation of circuit 30 will be better understood by reference to FIG. 3B. It illustrates the timing diagrams of the signals generated by the ACG circuit 30 of FIG. 3A in the ABIST system sub-mode, the rising edge of the D clock signal pulse initiates generation of the positive CACG clock signal, the negative CSACG signal and BACG and SACG clock signals. The pulse widths of the LSSD BACG and SACG clock signals are thus independent of the D clock signal pulse width.

The configuration of circuit 30 is adequate for optimal operation in the ABIST system sub-mode. However, it is not possible to use the falling edge of the D clock signal to control the falling edge of the LSSD SACG and BACG clock signals. Neither is it possible to use the falling edge of the D clock signal for the following two reasons: firstly, the D clock signal pulse width W is not easily controllable and secondly, since the memory units are tested in parallel, it cannot be asserted that the D clock signal pulse width will be adequate for all the macros. A further advantage of the circuit 30 configuration is that the memory units of all the SRAM macros incorporated in a single chip can be tested in parallel. This second configuration, in contrast to the first one, does not allow for an accurate access time measurement of the memory unit and thus, this measurement is not performed in the ABIST system sub-mode. Only, the self-test of the memory unit 12 is conducted by the ABIST unit 11.

Figure 4:
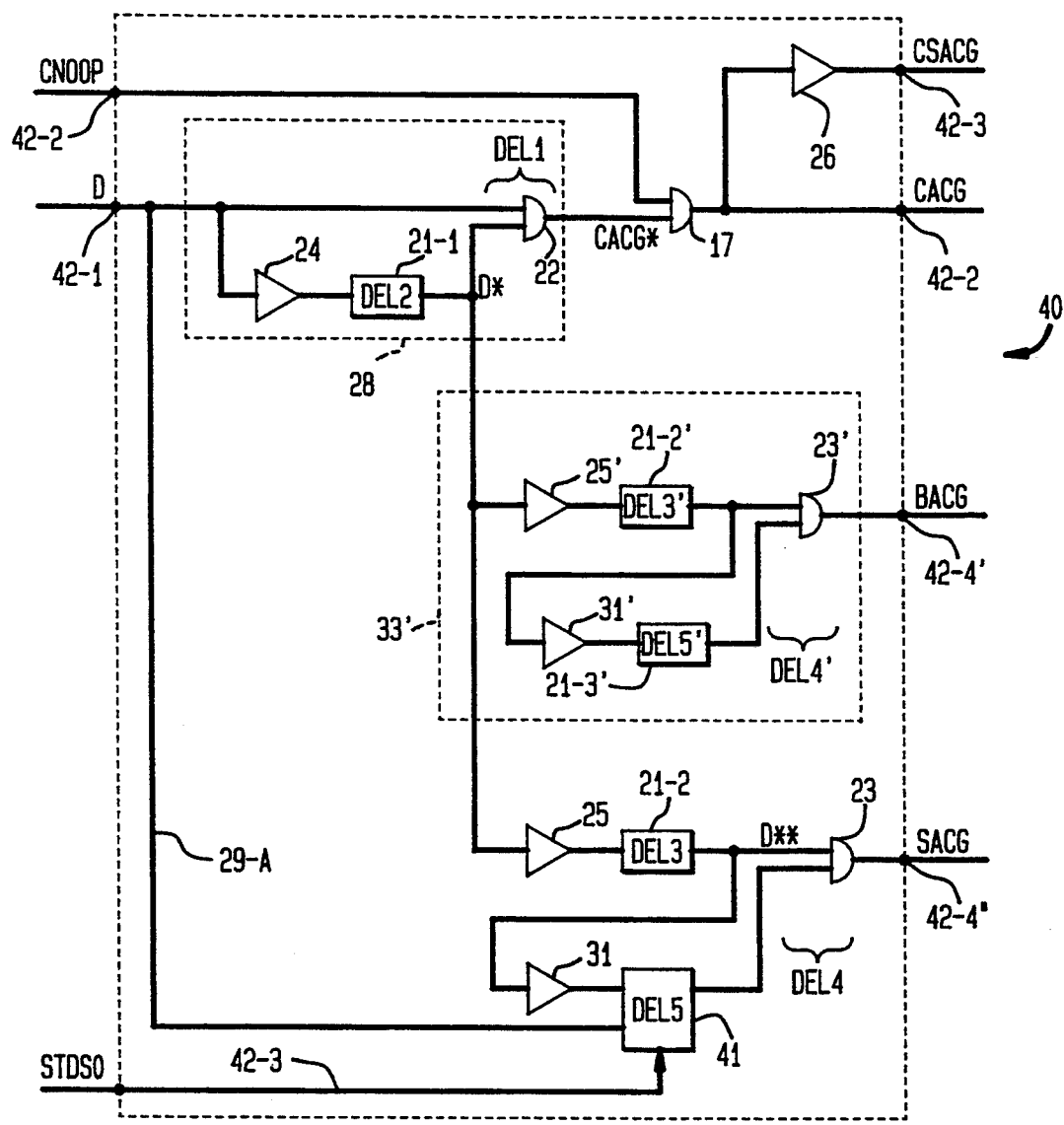
FIG. 4 shows the array clock generator circuit of the present invention which incorporates the two preferred embodiments of FIGS. 2A and 3A.

Now turning to FIG. 4, there is described a preferred embodiment of the array clock generator (ACG) circuit referenced 40 of the present invention incorporating the two circuit configurations of FIGS. 2A and 3A. To that end, the array clock generator circuit 40 is provided with a 2-way multiplexer 41, which allows the ACG circuit to operate in either of the two ABIST sub-modes. This multiplexer is controlled by a control signal labelled STDS0, generated by ABIST 11, thereby allowing digital programming of the appropriate configuration of circuit 40 depending on the selected ABIST sub-mode. This concept of programming could be extended by using a 2**N-way multiplexer controlled by a plurality N of control signals STDS0, ... to further subdivide the two ABIST sub-modes, should other features (ex: sort, relaxed timing measurements and test convenience) be required. Input and output terminals are generically referenced 42. The input D clock signal is applied to input terminal 42-1 and directly fed to the first input of the two-way AND gate 22. D is likewise fed via inverter 24 and delay line 21-1 on the second input of AND gate 22. This construction forms chopper circuit 28 as explained above. The latter generates the CACG* signal which is gated by the CNOOP signal in AND gate 17. The CSACG signal is derived therefrom via inverter 26 and is available at terminal 42-3. When CNOOP is low, the CACG and CSACG clock signals must be gated off. When CNOOP is high, the CACG and CSACG clock signals are generated from the ACG circuit 40. The signal D* which is outputted by delay line 21-1 is also applied via inverter 25 and delay line 21-2 to the first input of 2-way AND gate 23 (labelled D). Multiplexer 41, normally introduces an inherent delay DEL5 which corresponds to the delay produced either by optional delay line 21-3 in FIG. 2A or delay line 21-4 in FIG. 3A. Multiplexer 41 allows either the D clock signal (via shorted connecting wire 29A) or the D signal outputted by delay line 21-2 via inverter 31 to be applied to the second input of AND gate 23. This selection is performed by control signal STDSO which is applied to input terminal 42-2, depending on the selected ABIST sub-mode.

Clock signals CACG and SACG may be available at a single common output terminal (e.g., 42-4 not shown) but, preferably, at separate terminals as shown in FIG. 4, where they are referenced 42-4' and 42-4". In the latter case, clock signal SACG is generated by AND gate 23 from signal D**, while clock signal BACG is generated by circuit 33', structurally identical to circuit 33 of FIG. 3A but with different delays for further optimization. This feature presents some interest in case the logic designer needs additional freedom. ACG circuit 40 has two inputs, one for the D clock signal and the other for the STDS0 control signal. In turn, in the ABIST mode, the ACG circuit 40 generates the LSSD BACG and CACG clock signals for ABIST 11 of FIG. 1, the CSACG signal and the SACG clock signal for memory 12 and data-out shift register 14, respectively.

When STDS0=1, ACG circuit 40 operates according to the first configuration (circuit 20). The falling edge of the LSSD SACG and BACG clock signals are dependent on the falling edge of the D clock signal, as illustrated in FIG. 2B. When STDS0=0, ACG circuit 40 operates according to the second configuration (circuit 30). The falling edge of the LSSD BACG and SACG clock signals occur after the rising edge of the D clock signal, i.e., after a fixed delay equal to the sum of the internal delays, as apparent from FIG. 3B. As a result, multiplexer 41 provides a level of programmability to the ACG circuit 40 to optimally fulfill the needs of both ABIST sub-modes. In the ABIST manufacturing sub-mode (FIG. 2B), the SACG clock signal falling edge is provided by the D clock falling edge, thus allowing the precise measure of the memory access time. In addition, as each SRAM macro contains its own ACG circuit, one can easily adjust the D clock signal falling edge to measure the memory access time of each memory unit using its own dedicated ABIST unit 11. Moreover, it is relatively process independent. In the ABIST system sub-mode, the SACG clock signal pulse width is only fixed by the sum of internal delays of the ACG circuit 40 (which are so designed to insure that the data-out signals coming from the memory unit 12 are captured in latches 14-1 to 14-M of unit 14). In this sub-mode, the clock signal generation is independent of the D clock signal pulse width and there is no measurement of the memory access time.

It should be noted that a prior art SRAM macro architecture of FIG. 1 could operate with the internally generated clock signals from the ACG circuit 40, in accordance with the present invention or with standard separate external LSSD clock signals. It suffices to introduce appropriate OR gates in the signal paths, as admittedly within the scope of those skilled in the art. However, when using the ACG circuit 40 of the present invention, it is possible to run the ABIST 11 with a single clock, which in turn generates the ARRAY SELECT (CSACG) signal, the LSSD B (BACG), C (CACG) and S (SACG) clock signals. On the contrary, when running ABIST 11 with separate LSSD clock signals according to the clock distribution scheme 18, it is necessary to control the CS, B, C and the S signals external to the SRAM macro 10. The SCAN-IN mode, which is composed of alternating A and B clock signals, can be controlled only by separate external LSSD clock signals and not by the ACG circuit 40.

The ACG circuit 40 described above has been implemented in a silicon chip using a BiCMOS 0.8 um technology. It has been demonstrated to operate with a D clock signal running at 200 MHz (i.e. a 5 ns system cycle time). Moreover, the ACG circuit 40 is a high performance circuit, since it runs faster than this system cycle time. Circuit 40 can be implemented in any bipolar BiCMOS and CMOS technology. The ACG circuit 40 reduces the skew between clock signals due to the tester imprecision to a minimum, i.e., the skew caused by device mismatching, typically from 300 ps to about 50 ps.

As a matter of fact, this latter skew is inherent to any clock distribution scheme that is internally buffered. The novel ACG circuit fully satisfies the new low cost test strategy and performs the highly precise measurements that are required to date.

Although the present invention has been described for an SRAM macro, the ACG circuit 40 may find large applications in DRAMs, flash memories . . . etc.

While this invention has been particularly shown and described with reference to two preferred embodiments thereof, it will be understood by those skilled in the art that the foregoing and other changes in the form and detail may be made therein without departing from the scope and spirit of the invention.

We claim:

1. A SRAM that includes memory means, data-out shift register means, ABIST means, data compression circuit means, fail address register means and an array clock generator (ACG), said ACG comprising:
   a clock chopper that comprises a first AND gate having an inherent delay DEL1, a first input for receiving a D clock signal, a second input for receiving the D signal inverted by an invertor having an inherent delay DEL2, and an output that generates an ungated LSSSD C clock signal; and
   a second AND gate having an inherent delay DEL4, a first input connected to the output of an inverter having an inherent delay DEL3, said inverter is coupled to the invertor having the delay DEL2, a second input is controlled by the D clock signal and an output for generating LSSD clock signals B and S.

2. The SRAM as recited in claim 1, further comprising a third AND gate for generating a gated output LSSD C signal having a first input connected to the output of the first AND gate and a second input receiving a gating signal generated by the ABIST means.

3. The ACG circuit as recited in claim 2, wherein an Array Select signal is generated at the output of an inverted attached to said third AND gate.

4. The AGC circuit as recited in claim 1, wherein the second input of said second AND gate is connected to delay means having a predetermined delay DEL5, said delay means having its input controlled by the D clock signal.

5. The AGC circuit as recited in claim 4, wherein the delay means is a multiplexer having an inherent delay DEL5 responsive to a control signal generated by said ABIST means.

6. The AGC circuit as recited in claim 4, wherein said delay DEL1 is approximately equal to DEL4.

7. The AGC circuit as recited in claim 4, wherein said delay DEL1 is approximately equal to DEL1+DEL5.

8. The AGC circuit as recited in claim 1, further comprising a circuit responsive to the signal chopper for generating a LSSD clock signal B distinct from the LSSD S clock signal.

9. The AGC circuit as recited in claim 8, wherein said circuit has an input D* responsive to said D clock signal inverted and delayed by said delay DEL1, and further comprising an AND gate having an internal delay DEL4, a first input connected to an inverter having an inherent delay DEL3, said inverter responsive to the signal D* and a second input responsive to said inverter having said delay DEL3 responsive to a second inverter having an inherent delay DEL5, said AND gate generating at its output said LSSD clock signals B and S.

* * * * *